United States Patent [19]
Cavanaugh

[11] Patent Number: 5,105,247
[45] Date of Patent: Apr. 14, 1992

[54] QUANTUM FIELD EFFECT DEVICE WITH SOURCE EXTENSION REGION FORMED UNDER A GATE AND BETWEEN THE SOURCE AND DRAIN REGIONS

[76] Inventor: Marion E. Cavanaugh, 792 Paul Ave., Palo Alto, Calif. 94306

[21] Appl. No.: 562,470

[22] Filed: Aug. 3, 1990

[51] Int. Cl.⁵ .......................................... H01L 29/78
[52] U.S. Cl. ................................. 357/23.12; 357/12; 357/23.8; 357/23.9
[58] Field of Search ..................... 357/12, 23.12, 23.8, 357/23.9

[56] References Cited

U.S. PATENT DOCUMENTS

| | | | |
|---|---|---|---|
| 4,799,090 | 1/1989 | Nishizawa | 357/12 |
| 4,814,839 | 3/1989 | Nishizawa et al. | 357/23.12 |

FOREIGN PATENT DOCUMENTS

| | | | |
|---|---|---|---|
| 2607630 | 6/1988 | France | 357/12 |
| 53-112069 | 9/1978 | Japan | 357/23.12 |
| 57-106078 | 7/1982 | Japan | 357/23.12 |
| 59-154076 | 9/1984 | Japan | 357/12 |
| 60-245168 | 12/1985 | Japan | 357/12 |
| 61-27683 | 2/1986 | Japan | 357/12 |

OTHER PUBLICATIONS

IBM Technical Disclosure Bulletin, vol. 16, No. 7, Dec. 1973, "Field Induced Tunnel Diode", by Fischer, p. 2303.
Bate, "The Quantum Effect Device: Tomorrow's Transistor?", Scientific American, Mar. 16, 1988, pp. 96–100.
Sze, S. M., "Physics of Semiconductor Devices, Second Edition", John Wiley and Sons, 1981, pp. 97–98, 340, 402–407, 558–565.

Primary Examiner—Rolf Hille
Assistant Examiner—Steven Loke
Attorney, Agent, or Firm—Townsend and Townsend

[57] ABSTRACT

Semiconductor devices having at least three terminals and a single PN junction using quantum-effect tunneling for the primary conduction modes, including gates 32 and 34, drains 28 and 30, and sources 24 and 26, with the capability of operation in a unidirectional mode with implicit well taps or in bidirectional mode for pass gates.

7 Claims, 2 Drawing Sheets

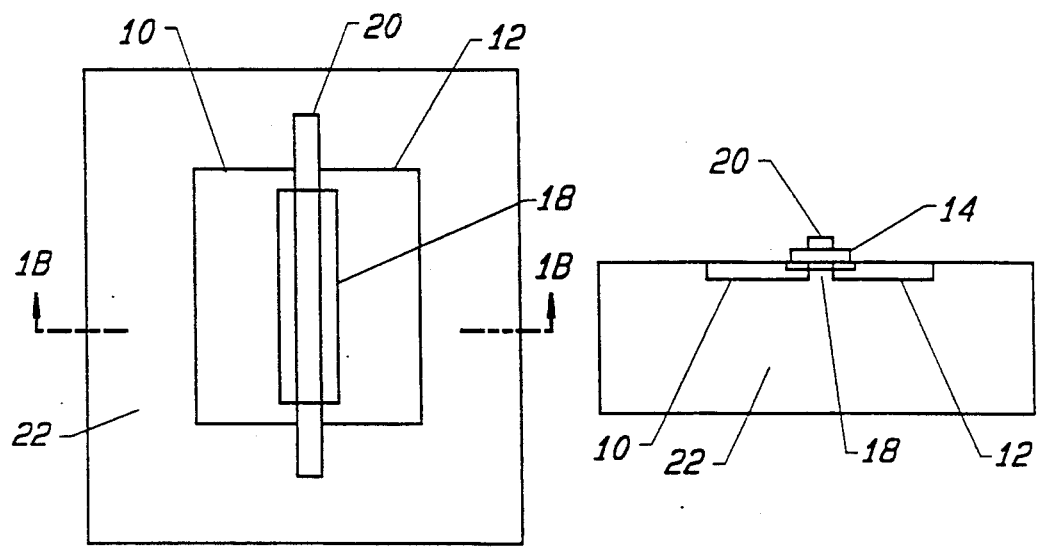
FIG. 1A
FIG. 1B
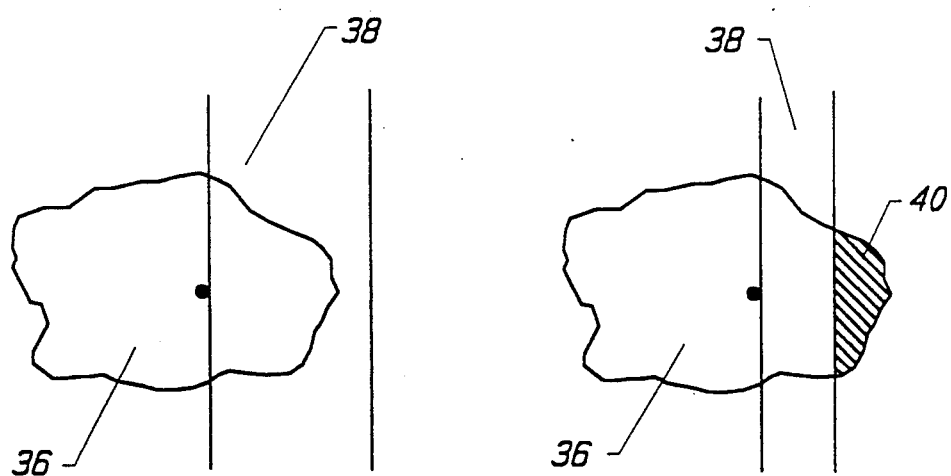
FIG. 2A
FIG. 2B

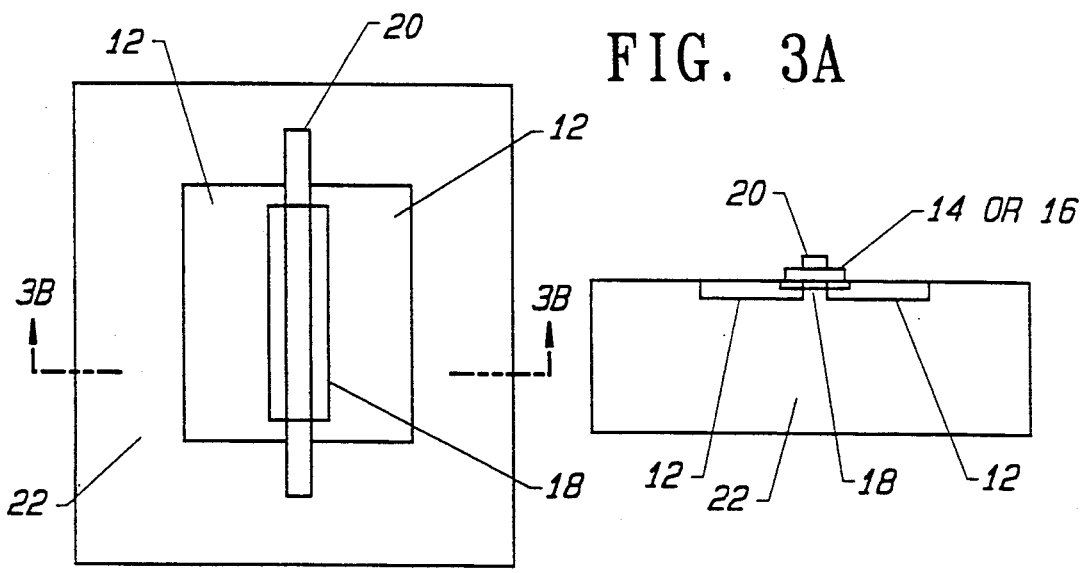
FIG. 3A
FIG. 3B
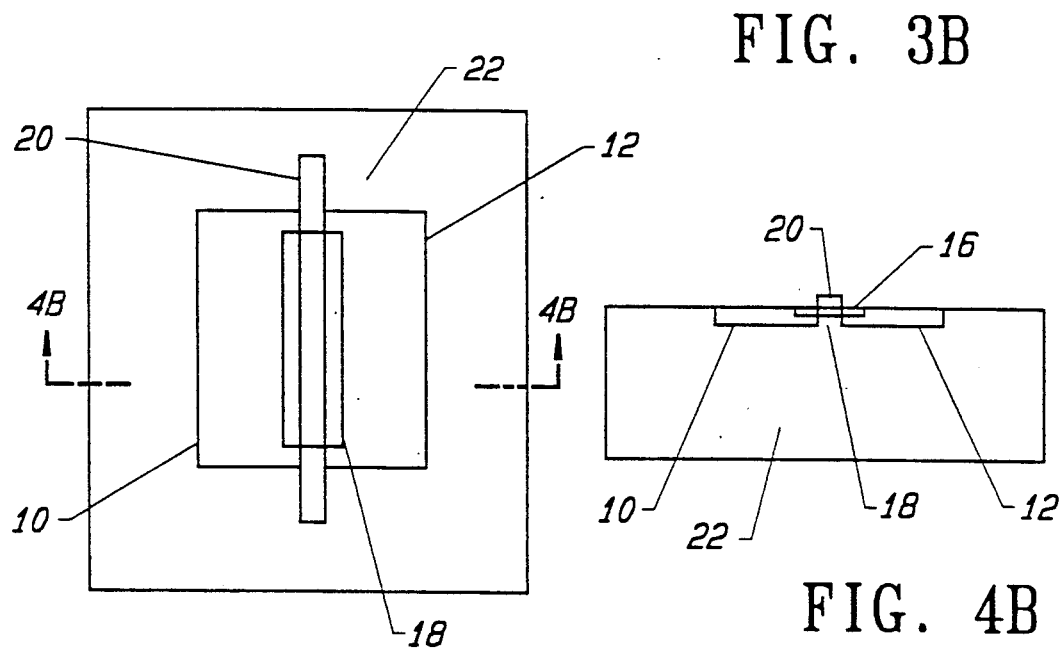
FIG. 4A
FIG. 4B
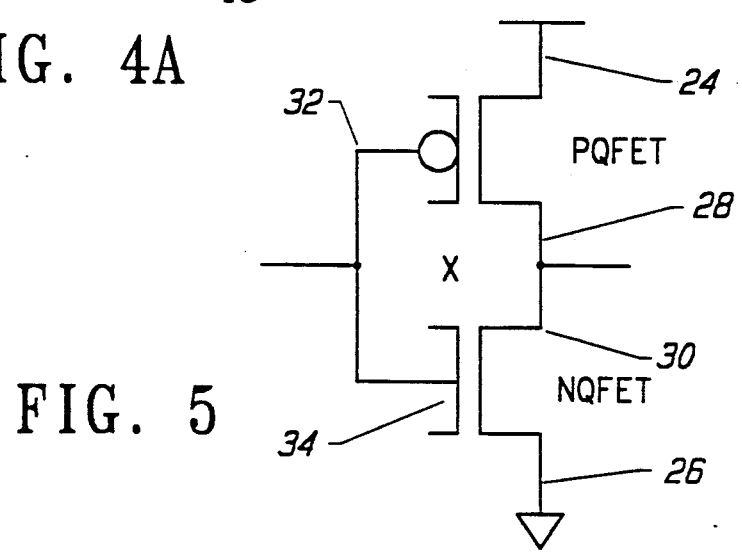
FIG. 5

QUANTUM FIELD EFFECT DEVICE WITH SOURCE EXTENSION REGION FORMED UNDER A GATE AND BETWEEN THE SOURCE AND DRAIN REGIONS

BACKGROUND—FIELD OF THE INVENTION

This invention relates to electronic devices, especially semiconductor devices including integrated circuitry, and more specifically to devices made using quantum effect carrier transmission in the conduction state.

BACKGROUND—DESCRIPTION OF PRIOR ART

One of the most important aspects of modern life is the extensive use of electronic devices in commercial, military, and personal applications. One example, though by no means inclusive, is in computers. In most uses of electronic devices, speed, or the rate at which the devices transition from conductive to non-conductive, is of great if not overriding importance.

The first electronic devices included the electronic tube or valve, which had many disadvantages in terms of size, speed, power consumption, and cost. With the development of the bipolar transistor, smaller, lower power, and lower cost elements became feasible. The bipolar transistor offered greater speed in general purpose applications and led to the first integrated circuit (IC), which offered even smaller, lower power, and lower cost elements than the bipolar transistor.

Relatively soon after the development of the bipolar transistor was the MOS (Metal Oxide Semiconductor) device. Although slower and less reliable than bipolar technology, the low cost and low power of the MOS transistor steadily gained applications for it. The MOS device then led to truly practical LSI (Large Scale Integration) and VLSI (Very Large Scale Integration) parts, which set new standards for low power and low cost combined with reasonable speed.

MESFET (Metal Enhanced Surface Field Effect Transistor) devices were developed primarily to address the speed issues, even though they were and are much less attractive from the standpoint of power and cost. These devices remain a secondary technology, used primarily in applications which require very high-speed devices.

It became apparent that future development lay in the direction of smaller size, and "scaling" or down-sizing became the most important emphasis of MOS technology, eventually making it the technology of choice in the most common and important applications.

Conduction of electrical charge proceeds in one of two ways: electrical and electronic. Electrical conduction is similar to hitting a billiard ball on a table full of balls. No one ball travels very far. The impulse is transmitted from ball to ball across the table and arrives at the far end of the table fairly quickly. Electronic conduction is like shooting a ball across a table with no other balls, but many stationary "bumpers" on it. The ball bounces around randomly (with a general movement across the table) until it finally hits the far side.

All of the previously described semiconductor devices relay on an electronic conduction area where the carrier transport (electronic impulse) speed is greatly reduced. This is because the carriers have to pass through an area of electronic conduction in the material where the limiting velocity of the carriers through ionic centers ("bumpers") in the material is substantially less than the electrical impulses carried by normal electrical conduction. A well-known phenomenon called impurity scattering, in which the "drifting" carriers collide with ionic centers, causes the reduction in carrier transport speed. For carrier activity relating to semiconductor devices, materials with a doping level substantially less than $10^{20}$ atoms per cubic centimeter have significant electronic properties; above that level of concentration, the electrical properties are predominant.

In silicon, the limiting velocity in lightly doped material is approximately 3000 times slower at room temperature than the electrical velocities in very heavily doped ($10^{20}$ atoms per cubic centimeter) semiconductors and similar conductors, such as metals. Even in the case of GaAs HEMT (Gallium Arsenide High Electron Mobility Transistors), a less desirable technology in most respects, the limiting velocities for electronic conduction are approximately ten times slower than electrical velocities. Much work has been done to further reduce the size and increase the speed of semiconductor devices, but the other electrical requirements, such as voltage handling and power requirements, limit the amount of size reductions.

Additionally, prior technologies suffered from limited gain at vary low voltages, such as one volt, and some technologies, such as many MOS devices, require higher voltages, such as five volts, to reduce the effects of process-related ambiguities in their operating points, thereby increasing the power requirements of these devices and further limiting speed.

Junction areas in semiconductors can be heavily doped with impurities such as boron, arsenic, or other materials appropriately combined with semiconductor material in the proper proportions (a concentration of about $10^{19}$ atoms per cubic centimeter or greater; silicon and gallium arsenide are known to have about $10^{23}$ atoms per cubic centimeter). Junctions having such heavy concentrations are known to exhibit an effect called quantum tunneling. In quantum tunneling, the mean free path of an excited electron orbiting around an atom is great enough compared to the junction barrier width or depletion region thickness that the electron can be shown, in probability theory, to exit on both sides of the junction barrier.

This relatively narrow barrier is therefore conductive, and is less than a hundred Angstroms to a few hundred Angstroms wide. These examples use the most common materials in the most common conductions of usage, where an Angstrom unit is commonly known to be $10^{-10}$ meters in size. In my invention, the junction barrier or depleted region is widened and narrowed in response to a controlling means. These means might typically be an electric field projected into the material, such as a voltage stress introduced by external means.

Quantum tunneling has been known for many years, being the basis for the Esaki or tunnel diode. It was first demonstrated in the 1930's by Dr. Leo Esaki and is well-known in the art.

More lightly doped tunnel diodes with relatively insignificant conduction characteristics, called back diodes, were developed at or near the same time. Tunnel diodes and back diodes together illustrate the conduction and non-conduction modes of my invention; however, tunnel and back diodes have no separate control terminal and cannot be used in the same way as my invention. The following paragraphs describe the theory and operation of my invention.

SUMMARY OF THE INVENTION

The invention described in this patent application is the Quantum Field Effect Device (QFET), in which I have invented a method to control and take advantage of quantum tunneling. In my invention, quantum tunneling is controlled by introducing an electrostatic field into the semiconductor to modulate the concentration on one side of the junction. This modulation varies the junction width so that the electron mean free path becomes larger than the junction barrier width, and the electron exists on both sides of the junction barrier. The modulation requires exposing the area of concentration to a very intense field, which in turn requires that the dimensions of tunneling regions be very small so that voltages of reasonable value can be applied.

The following equation expresses this relationship:

FIELD STRENGTH = VOLTAGE/DISTANCE

The intense electrostatic fields mentioned in the previous paragraph are not believed to have any adverse effect on either the operation or reliability of the devices of my invention. However, intense fields (even at much larger dimensions of a micron or so) are deleterious to MOS devices due to several phenomena, including the "hot-electron" effect. In the hot-electron effect, an "electron wind" impacts atomic structures with such force in and near the electronic conduction areas that it physically alters the structure and decreases the reliability of MOS devices.

Further, primary and secondary emissions into the substrate material and into the gate area are known to negatively impact performance in MOS devices. As a result, conventional FETs appear to have a lower size limit of 0.2 to 0.5 micron on the gate or electronic conduction length. In my invention, the device size can be less than 0.1 micron with similar manufacturing methods and precautions, and may be capable of very significant size reduction of an order of magnitude or more.

The area of the semiconductor in which the concentration is so modulated would typically be about 100 Angstroms thick, and the dielectric region through which the field is introduced is very thin, on the order of 20 Angstroms. The dielectric region can be a separate dielectric layer (14 in FIG. 1B) or, alternatively, it can be a depleted region at the semiconductor surface (16 in FIG. 3B).

My invention provides the obvious advantages of reduced size and the resulting improvements in cost and speed. These size reductions are possible because devices using my invention can be controlled by a single junction (although multiple junctions within a device are possible). Also, my invention does not suffer from velocity limiting or deleterious, hot-electron effects because the conduction fields are confined to electrical areas rather than electronic areas as in the prior art.

As shown in the previously described problems and limitations, conventional state-of-the-art semiconductor devices suffer from size, speed, and power limitations. Quantum devices have been known for a considerable period of time, but could not be employed in a way to solve these limitations prior to my invention.

Though not a restriction of my invention, there would normally be four regions in the semiconductor: a semiconductor body region, a source connection region which is too heavily doped to be significantly modulated by the controlling field, a drain connection region which is also too heavily doped to be significantly modified by the controlling field, an extended source region, which is normally the surface of the semiconductor, with a controlling gate very near the source connection region.

The concentration of the extended source is modulated by the controlling gate. The modulation widens and narrows the junction between the source region and the drain region causing quantum tunneling through the junction barrier to exist or not exist in accordance with the applied field.

My invention anticipates either depletion or enhancement devices. A depletion device is normally on and is turned off by a reverse polarity voltage, which is opposite to the polarity of the drain voltage. An enhancement device is normally off and is turned on by a forward polarity, which is the same as the polarity of the drain voltage.

In the case of complementary devices, local areas of doping, often called tubs or wells, are not shown in the description of my invention. These areas allow the substrate to assume the polarity of one of the electrodes but with far lighter concentrations (about $10^{16}$ atoms per cubic centimeter) to prevent the drain from being shorted to the substrate and to provide isolation between device types. Tubs and wells are so well-known in the semiconductor art that they are assumed.

Accordingly, several objects and advantages of my invention are:

(a) To eliminate areas of electronic conduction, thereby reducing device size and increasing device speed, so that all conduction proceeds by electrical (rather than electronic) means and by quantum tunneling (that is, impulses rather than "drifting" carriers).

(b) To eliminate areas of electronic conduction by replacing them with quantum tunneling junctions, so that decreases in size do not depend on the electrical requirements of the conduction areas.

(c) To provide a device in which the applied voltage is very small (less than one volt) without compromising performance. Prior art devices normally operate at about five volts.

(d) To provide a practical way to enjoy the cost and speed advantages inherent in small size devices.

(e) To provide the great advantage of the inherently higher speed of electrical conduction within a device (as opposed to electronic conduction).

Using a single junction with a separate gate to control conduction by permitting or preventing tunneling currents represents a significant improvement over the previous methods. All the major methods of controlling conduction in the prior art use two junctions with an area of electronic conduction between them, requiring larger size and slower operation. My invention uses shallow junctions and small dimensions without encountering the deleterious effects of "hot electrons" found in MOS devices. Additionally, my invention uses low-cost, well-known silicon technology and maintains full compatibility with MESFET technology, such as GaAs device construction.

Further objects and advantages will become apparent from a consideration of the ensuing description and drawings.

DRAWING FIGURES

In the drawings, related figures have the same number but different alphabetic suffixes.

FIGS. 1A and 1B show a topological view and a cross-section of the same view, revealing typical details of the vertical construction of one embodiment of my invention.

FIGS. 2A and 2B are illustrations of atomic level tunneling showing the basic physical mechanism of the quantum effect in my invention.

FIGS. 3A and 3B show a topological view and a cross-section of the same view, revealing typical details of the vertical construction of another embodiment of my invention.

FIGS. 4A and 4B show a topological view and a cross-section of the same view, revealing typical details of the vertical construction of another embodiment of my invention.

FIG. 5 is a schematic of a typical application of my invention in silicon, with devices of two conductivity types, N type and P type, in a configuration generally known as C type, or complementary.

Reference Numerals on Drawings

10 P doped region
12 N doped region
14 insulating layer
16 surface depleted region
18 P or N conductivity modulation region
20 gate means for field introduction
22 substrate or well or tub material
24 source of PQFET
26 source of NQFET
28 drain of PQFET
30 drain of NQFET
32 gate of PQFET
34 gate of NQFET
36 electron cloud
38 junction barrier
40 quantum tunneling probability function

DETAILED DESCRIPTION OF ILLUSTRATIVE EMBODIMENTS

A typical embodiment of my invention is shown in FIGS. 1A and 1B. In FIG. 1A (an N-type device having an N-type substrate or well), the device source is N-doped region 12; the device drain is P-doped region 10. Alternatively, in a P-type device, the substrate or well is P-type; the device source is P-doped region 10; the device drain is N-doped region 12. FIG. 1B is a section view of the N-type device 10 and shows a gate means (20) on the surface between the source and the drain with an N-doped conductivity region (18) beneath the gate means. On an P-type device, a P-doped conductivity region is used. A silicon oxide insulating layer (14) separates the gate (20) and the region (18).

Conductance through the junction in the tunneling mode is controlled by changing the junction width. It is well-known in the art that as the dopant of an area adjacent to the junction is increased, the junction narrows, and tunneling can begin. Conversely, reducing the dopant tends to inhibit existing tunneling. It is also well-known that a bias on a gate, by electrostatic action, increases or decreases the dopant level immediately below the gate and can reverse the material polarity with light dopant. This is the basis for operation of prior art MOS and MESFET devices.

In my invention, and unlike the prior art, the direct effects of a bias on the gate are of secondary importance. Instead, the effect of this change in dopant levels is used to control the PN junction width, thereby controlling tunneling through the junction, and controlling the device conductance.

During the manufacturing steps, ion implantation, diffusion, deposition, heat treatments, and/or MBE (molecular beam epitaxy) are used to realize the structure of my invention, together with other methods, chemical, thermal, and mechanical, which are well-known to those familiar with the art. In the case of Gallium Arsenide variations of my invention, MBE (molecular beam epitaxy) will probably be the preferred method of realizing practical devices.

Typical steps in fabricating the device of my invention are as follows. Only the most important steps are shown; intermediate steps, which are well-known in the art and subject to considerable variation, are omitted.

1. Select a suitable host material, which is normally supplied by vendors in the form of thin (normally 0.02 inches thick) round (normally 2 to 8 inches in diameter) semiconductor wafers.

2. Select or form a suitable semiconductor body (22 in FIG. 1) region with relatively low dopant material ($10^{16}$ atoms per cubic centimeter), which might be the wafer bulk, or might alternately be a tub or well, commonly known in CMOS technology. The well can be on the order of 0.5 micron deep.

3. Form a source region (10 in FIG. 1) which is normally heavily concentrated with dopant ($10^{20}$ atoms per cubic centimeter) to provide good electrical conduction characteristics to the interconnecting material on the surface and through the bulk material. In CMOS or other MOS or MESFET construction, the source material would be of the opposite conductivity type to the substrate or well (body) but, in my invention, it is of the same conductivity type. The source region depth can be on the order of 1,000 Angstroms.

4. Form a drain region (12 in FIG. 1) of the opposite conductivity type or doping, but with a similar concentration, very close to the source as discussed in step 3. Again, the drain region depth can be on the order of 1,000 Angstroms.

5. Use a gate material (20 in FIG. 1), such as silicon gate or refractory metal gate, as a mask against dopant introduction to further define the source and drain edges at the active device edges. This mask improves the device's accuracy and characteristics. The gate is formed over a thin dielectric (10 to 100 Angstrom silicon dioxide, or glass) and is typically less than 1000 Angstroms thick to allow precise definition. The gate could also be deposited over relatively light dopant material which might be formed with the use of MBE, or molecular beam epitaxy, and form a Schottky barrier diode and a depleted region thin enough, on the order of 10 to 200 Angstroms, for device modulation, rather than being formed over a dielectric.

6. Form a thin (100 Angstrom) source or drain extension material (18 in FIG. 1) immediately below the gate using ion implantation, either before the gate is deposited or through the gate. This extension material, with the correct dopant concentration ($10^{19}$ atoms per cubic centimeter) forms a back, or tunnel, diode. Conduction by tunneling is then controlled by using a bias on the gate to control the concentration in the source extension. This source extension controls the width of the PN junction due to the interdependence between junction width and dopant concentration on each side of the junction. In the prior art, bias on the gate is used to control conduction through a channel or base region. In my invention, bias is used to control the dopant distribution on one side of the PN junction allowing the use of substantially smaller geometries.

7. Add the remaining layers and materials (not shown) to complete the device.

FIGS. 2A and 2B illustrate the concept of junction widening and narrowing with an idealization of a single electron "cloud", or mean free path of an orbiting electron, which is the basic operating mode of my invention. With an enabling field applied, the increased conductivity of the controlled region causes the junction barrier to become small or thin. The electron has a probability function (exists) on both sides of the junction barrier. With a disabling field applied, the junction barrier becomes thicker or larger, and the electron has no probability function (does not exist) on one side of the junction barrier. Thus electrical conduction exists or does not exist (except for minor leakage currents) in accordance with the applied controlling field.

FIG. 3 shows the device of FIG. 1 in which two P-type drains (12) are formed in an N-type substrate or well rather than an N-type source and a P-type drain. The N-type source region (18) forms PN junctions with both drains (12). This allows the effect of "back-to-back" devices because the QFET (both N and P) is a short circuit in the reverse direction. This configuration allows bidirectional passgates, popular in MOS technology, to be easily built.

FIG. 4 shows a construction that is similar to the construction of FIG. 1, except that a Schottky gate (gate forming a Schottky diode) is used to modulate the conductance of the extended source, instead of a gate over a thin dielectric. This is generally the preferred method of construction in Gallium Arsenide, where thin dielectrics are difficult to form. This variation achieves the same effect with a reduction in elements by eliminating the insulating layer of FIG. 1B. This is important in Gallium Arsenide devices where an insulating layer is difficult to implement at the required quality levels.

FIG. 5 shows a schematic drawing of the devices of my invention arranged in complementary mode. A PQFET (P-type Quantum Field Effect Transistor) and an NQFET (N-type Quantum Field Effect Transistor) are arranged so that a normal input voltage will always turn one of the two on and the other off. Drive voltage and current is provided at the output of the devices, but there is no path through the other device, so power is not wastefully flowing through both devices at the same time. This has proven to be the most useful configuration in large scale integrated circuits, and is mandatory in many cases to reduce power consumption. A voltage, for example, of 0.3 volts, is applied to the source of a PQFET device (24). Ground is applied to the source of an NQFET device (26). The drains of the two devices (28 and 30) are tied together, as are the gates (32 and 34). An input signal with an amplitude of 0.3 volts and traversing from the high or 0.3 volt state to a 0 or ground state is applied to the common gates. When the input is at a high state, the output is observed to be at a low or ground state.

Conversely, when the input is at a low or ground state, the output is observed to be at a high or 0.3 volt state. In this respect, the functional operation is no different from CMOS (Complementary Metal Oxide Semiconductor) devices in common use in integrated circuits today. In my invention, however, the time delay between input and output is determined solely by electrical conduction and current-limited capacitances. This is in contrast to prior art devices, in which the same limitations exist, but another significant transit-time (electronic conduction) delay is encountered.

Thus my invention differs externally from the prior art in that it allows for significantly higher speeds and the use of lower voltages (which can significantly affect power dissipation and speed), and internally in that quantum tunneling, rather than electronic conduction mechanisms, is involved.

SUMMARY

Accordingly, by adding a third controlling electrode in addition to the conduction path, my invention exploits a well-known but previously uncontrollable physical phenomenon and allows devices which are capable of faster operation and are much easier to scale down to very small sizes than the conventional devices in use today. My invention also offers many advantages, including the following:

It eliminates some very serious problems, primarily those which are well-known as hot-electron effects, which have adverse effects on reliability and operability within the present limits of device scaling. This improvement is due to conduction being across a single junction rather than between multiple junctions.

It allows exclusively electrical conduction in which the electrical impulse travels much faster, as opposed to electronic conduction.

It allows smaller sizes, or greater down-scaling, than the prior art.

It permits the use of current process technology, although with different uses of the steps. For example, a P-type and an N-type impurity is used in each QFET device as opposed to MOS and MESFET, in which two diffusions of the same type are used for the source and drain connections, but with opposite polarities between complementary devices.

It allows the implementation of the circuits used in prior art CMOS designs, with similar or possibly reduced requirements for the inclusion of "well taps" and smaller wells of tubs.

It avoids the "hot-electron" effects that are known to be deleterious to operation and to reliability in the intense fields of small geometries.

Although the previous descriptions contain several embodiments, the description does not limit the scope of the invention, but rather provides illustrations of some of the presently preferred applications for this invention. For example, the P or N region used as a source of drain on one device could be shared by another similar device in the well-known "or-tie" connection of parallel MOS and MESFETs. Also, because the source can be the same polarity as the substrate in appropriate cases, the "well tap" bias terminal for a well region of CMOS, which introduces extra connections and complicates the design, can be eliminated to produce a simpler, more efficient layout.

Thus variations, modifications, and applications will occur to those skilled in the art without departing from the true spirit and scope of the invention as defined by the appended claims.

I claim:

1. A quantum field effect transistor device comprising:
   a semiconductor body region of a first conductivity type,
   a source region in said body region of said first conductivity type, said source having a dopant concentration on the order of $10^{20}$ atoms per cubic centimeter,
   a drain region in said body region of a second conductivity type opposite to said first conductivity type, said drain having a dopant concentration on the order of $10^{20}$ atoms per cubic centimeter, said source including a source extension with a dopant concentration on the order of $10^{19}$ atoms per cubic centimeter which contacts said drain region and forms a PN junction therewith,
   a gate adjacent to said PN junction,
   means for forward biasing said PN junction, and
   means for voltage biasing said gate, modulating the conductivity of said source and thereby modulating the width of said PN junction so that carrier tunneling through said PN junction is controlled between said source and said drain with said PN junction forward biased.

2. The device of claim 1 wherein said source is a shallow dopant region on the order of 1000 Angstroms in depth, said drain is a shallow dopant region on the order of 1000 Angstroms in depth, said source extension is a shallow dopant region approximately 100 Angstroms in depth, and is adjacent to said surface of said semiconductor body, and said gate is a thin layer on the order of 1000 Angstroms in thickness.

3. The device of claim 1 wherein said body region includes a well region which is a shallow region on the order of 0.5 micron deep, and the surface dimensions are at least large enough to contain said drain region.

4. The device of claim 1 wherein the region between said gate and said source extension is an insulating layer and has a thickness of 10 to 50 Angstroms.

5. The device of claim 1 wherein the region between said gate and said source extension is a semiconductive region so that a Schottky diode is formed above said source extension and forms a depleted region thin enough, on the order of 10 to 200 Angstroms, to modulate said source extension.

6. The device of claim 1 wherein said source extension has a dopant concentration so that said device is of the depletion mode type and is conductive when said gate and said source are at the same voltage.

7. The device of claim 1 wherein said device can be made less conductive by biasing said gate with a suitable voltage of the opposite polarity than the drain supply voltage.

* * * * *